United States Patent
Baüml et al.

(10) Patent No.: US 8,532,319 B2
(45) Date of Patent: Sep. 10, 2013

(54) FILTER BANK CONFIGURATION FOR A HEARING DEVICE

(75) Inventors: Robert Baüml, Eckental (DE); Heinz Goeckler, Backnang (DE); Thomas Kurbiel, Erkenschwik (DE); Henning Puder, Erlangen (DE); Wolfgang Sörgel, Erlangen (DE)

(73) Assignee: Siemens Medical Instruments Pte. Ltd., Singapore (SG)

( * ) Notice: Subject to any disclaimer, the term of this patent is extended or adjusted under 35 U.S.C. 154(b) by 454 days.

(21) Appl. No.: 12/833,171

(22) Filed: Jul. 9, 2010

(65) Prior Publication Data

US 2011/0007918 A1 Jan. 13, 2011

(30) Foreign Application Priority Data

Jul. 9, 2009 (DE) .......................... 10 2009 032 434
Aug. 7, 2009 (DE) .......................... 10 2009 036 610

(51) Int. Cl.
*H04R 25/00* (2006.01)

(52) U.S. Cl.
USPC ........................................................ 381/320

(58) Field of Classification Search
USPC ........................................................ 381/320
See application file for complete search history.

(56) References Cited

U.S. PATENT DOCUMENTS

| | | | |
|---|---|---|---|
| 6,393,083 B1 | 5/2002 | Beukema | |
| 8,085,960 B2 * | 12/2011 | Alfsmann et al. | 381/320 |
| 2005/0185798 A1 | 8/2005 | Carney | |
| 2007/0276656 A1 | 11/2007 | Solbach et al. | |
| 2009/0290736 A1 * | 11/2009 | Alfsmann et al. | 381/320 |
| 2009/0290737 A1 * | 11/2009 | Alfsmann | 381/320 |
| 2010/0128911 A1 * | 5/2010 | Elmedyb et al. | 381/320 |
| 2011/0081026 A1 * | 4/2011 | Ramakrishnan et al. | 381/94.3 |

OTHER PUBLICATIONS

Dam et al., "Interractive Method for the Design of DFT Filter Bank" IEEE Transactions on Circuits and Systems—II: Express Briefs, vol. 51, No. 11, Nov. 2004, pp. 581-586.
Brennan et al.,"A Flexible Filterbank Structure for Extensive Signal Manipulations in Digital Hearing Aids", In. IEEE, Proceedings of the International Symposium on Circuits and Systems May 31 to Jun. 3, 1998, ISCAS 1998, vol. 6, pp. VI-569-VI-572.
Hermann et al., "Window Based Prototype Design for Highly Oversampled Filter Banks in Audio Applications" In. IEEE Acoustics, Speech and Signal Processing, 2007, ICASSP, 2007, pp. II-405-II-408.

* cited by examiner

*Primary Examiner* — Jeffrey Donels
(74) *Attorney, Agent, or Firm* — Laurence A. Greenberg; Werner H. Stemer; Ralph E. Locher

(57) ABSTRACT

A filter bank configuration for a hearing device has filters in an analysis filter bank and corresponding filters in a synthesis filter bank that are coupled pair-wise to form a channel in each case. In order to compensate for a hearing loss, sub-band signals are amplified in the individual channels with the aid of multipliers. In the process, an audible distortion of an output signal Y of the filter bank configuration as a result of differences between amplification factors of the multipliers of neighboring channels should be prevented. Here, at least one channel changes a phase of a sub-band signal transmitted by the channel such that a difference between a group delay of the filter bank configuration and a prescribable reference value is reduced for at least one predetermined frequency. The filter bank configuration is particularly suited to hearing aids.

13 Claims, 4 Drawing Sheets

FILTER BANK CONFIGURATION FOR A HEARING DEVICE

CROSS-REFERENCE TO RELATED APPLICATION

This application claims the priority, under 35 U.S.C. §119, of German patent applications DE 10 2009 032 434.8, filed Jul. 9, 2009, and DE 10 2009 036 610.5, filed Aug. 7, 2009; the prior applications are herewith incorporated by reference in their entirety.

BACKGROUND OF THE INVENTION

Field of the Invention

The invention relates to a filter bank configuration for a hearing device. In the filter bank configuration, filters in an analysis filter bank and corresponding filters in a synthesis filter bank are coupled in pairs and so each pair of coupled filters forms a channel. Here, a hearing device is understood to mean a hearing aid, in particular.

Hearing aids are portable hearing devices used to support the hard of hearing. In order to make concessions for the numerous individual requirements, different types of hearing aids are provided, e.g. behind-the-ear (BTE) hearing aids, hearing aids with an external receiver (receiver in the canal—RIC) and in-the-ear (ITE) hearing aids, for example concha hearing aids or canal hearing aids (ITE, CIC) as well. The hearing aids listed in an exemplary fashion are worn on or in the concha or in the auditory canal. Furthermore, bone conduction hearing aids, implantable or vibrotactile hearing aids are also commercially available. In this case, the damaged sense of hearing is stimulated acoustically, mechanically, or electrically.

In principle, the main components of hearing aids are an input transducer, an amplifier and an output transducer. In general, the input transducer is a sound receiver, e.g. a microphone, and/or an electromagnetic receiver, e.g. an induction coil. The output transducer is usually designed as an electroacoustic transducer, e.g. a miniaturized loudspeaker, or as an electromechanical transducer, e.g. a bone conduction receiver. The amplifier is usually integrated into a signal-processing unit. This basic design is illustrated in FIG. 1 using the example of a behind-the-ear hearing aid. One or more microphones 2 for recording the sound from the surroundings are installed in a hearing aid housing 1 to be worn behind the ear. A signal-processing unit 3, likewise integrated into the hearing aid housing 1, processes the microphone signals and amplifies them. The output signal of the signal-processing unit 3 is transferred to a loudspeaker or receiver 4, which emits an acoustic signal. If necessary, the sound is transferred to the eardrum of the equipment wearer using a sound tube, which is fixed in the auditory canal with an ear mold. A battery 5 likewise integrated into the hearing aid housing 1 supplies the hearing aid and in particular the signal-processing unit 3 with energy.

More particularly, a hearing aid is used to compensate for a hearing impairment of a wearer of the hearing aid by amplifying the microphone signal. Since a hearing impairment typically has a different extent of development depending on the frequency of a sound signal, it is necessary to decompose the microphone signal into its spectral components for amplifying the microphone signal, and to undertake the amplification in a frequency-dependent fashion. A digital filter bank configuration with an analysis filter bank and a synthesis filter bank is often used for the spectral decomposition of the microphone signal into sub-band signals.

FIG. 2 illustrates a signal-flow graph for a typical filter bank configuration of a hearing aid. The filter bank configuration comprises an analysis filter bank 6 and a synthesis filter bank 7. The analysis filter bank 6 is composed of a total of I filters 8, of which a total of three filters $H_1$, $H_i$, $H_I$ are illustrated in FIG. 2. Hereinbelow, the index is also used to refer to all filters 8 as filter $H_i$, $i=1 \ldots I$. By way of example, a typical filter bank configuration can comprise I=64 filters 8. The filter $H_1$ is a low-pass filter; the remaining filters are band-pass filters with different central frequencies. The analysis filter bank 6 outputs the signals that have been filtered by the individual filters 8 with a reduced clock rate. In FIG. 2, this is symbolized by clock-rate reducers 9, in which digital values are in each case emitted at an output at a rate that is reduced by a factor of 1/M compared to the rate of the values read in at an input. A typical value of this under-sampling is M=16. The clock rate reduction can be achieved by not outputting M−1 values of M values received in succession.

The synthesis filter bank 7 likewise comprises I filters 10, with a spectral pass band thereof corresponding to the pass band of the filter in the analysis filter bank 6 coupled to the respective filter 10 in the synthesis filter bank 7. Hence, the filter $G_1$ shown in FIG. 2 is a low-pass filter, the pass band of which corresponds to the pass band of the low-pass filter $H_1$. Similarly, the pass bands of the band-pass filters $G_i$ and $H_i$, $i=2 \ldots I$, correspond to one another. Some of the band-pass filters in FIG. 2 are merely indicated by outlet points. The synthesis filter bank 7 typically also increases the clock rate. This is symbolized in FIG. 2 by clock-rate increasers 11. The locations of the clock-rate reducers 9 and clock-rate increasers 11 in an actual filter bank configuration depend on the design type of the latter.

The analysis filter bank 6 subdivides a digital input signal X into I sub-band signals. For this, each filter $H_i$, $i=1 \ldots I$, filters out a certain spectral band from the input signal X. For this, the frequency response thereof has a pass band, a roll-off band and a stop band. A sub-band signal is usually a sequence of complex numerical values. The use of multipliers 12 then allows an amplification of the individual sub-bands. The amplification factors of the multipliers 12 are specified in FIG. 2 as factors $F_1$, $F_i$, $F_I$. The synthesis filter bank is used to convert the amplified sub-band signals into signals with a higher clock rate and these are subsequently combined to form an output signal Y.

Since each filter $H_i$, $i=1 \ldots I$, in the analysis filter bank 6 filters out a certain spectral band from the input signal X, which spectral band is subsequently processed separately, the individual signal paths between a filter $H_i$ and the corresponding filter $G_i$ are also referred to as channels of the filter bank configuration. Hereinbelow, a channel is referred to by the index i of the associated filters $H_i$ and $G_i$.

In order to ensure high aural quality of the output signal Y, the filter pair $H_i$, $G_i$ has to be coordinated in each channel i. Suitable filter pairs can be obtained by different design methods for filter bank configurations. By way of example, a known standard design method is the method of Dam, Nordholm, Cantoni and de Haan (H. H. Dam, S. Nordholm, A. Cantoni and J. M. de Haan: "Iterative method for the design of DFT filter bank", IEEE Transactions on Circuits and Systems II: Express Briefs, Volume 51, Issue 11, November 2004, pages: 581-586).

In particular, the design methods ensure that a filter pair $H_i$, $G_i$ delays a signal transported over the corresponding channel i as little as possible. In the process, care also has to be taken for the delay in all channels i, $i=1 \ldots I$, to correspond to a reference value in their respective pass bands, which reference value is the same for all channels such that individual spectral components in the output signal Y are not offset in time with respect to one another. Herein, a delay is often measured in clock cycles of the digital system.

A group delay can be determined for the filter bank configuration or for components thereof in order to evaluate the quality of a filter bank configuration. A group delay specifies the delay experienced by an individual spectral component, with a certain frequency f, of an input signal X when it is imaged via a filter bank configuration in a corresponding spectral component of an output signal Y. The group delay is often determined not for absolute frequencies f but for the angular frequencies $\Omega$ normalized to the sampling rate $f_A$ of the associated digital signal. Here $\Omega$ is defined as per the following equation 1:

$$\Omega = 2\pi f/f_A.\qquad\text{Equ. 1}$$

In order to determine the quality, the distortion function is also examined in addition to the group delay of the entire filter bank configuration. This measure likewise allows conclusions to be drawn about the quality of the entire filter bank configuration. By way of example, a distortion function $T(e^{j\Omega})$ can be determined as per the following equation 2:

$$T(e^{j\Omega}) = 1/M[\Sigma^I_{l=1} F_l H_l(e^{j\Omega}) G_l(e^{j\Omega})].\qquad\text{Equ. 2}$$

Equation 2 establishes that the influence of the complex transmission function $H_l(e^{j\Omega})$ of the filters in the analysis filter bank and the influence of the complex transmission function $G_l(e^{j\Omega})$ of the filters in the synthesis filter bank are taken into account in the distortion function $T(e^{j\Omega})$ for each frequency $\Omega$. Moreover, the influence of the factors $F_l$ is taken into account. The distortion function $T(e^{j\Omega})$ can be used to calculate a value for a group delay $\tau(\Omega)$ as per the following equation 3:

$$\tau(\Omega) = -1\partial arg\{T(e^{j\Omega})\}/\partial\omega.\qquad\text{Equ. 3}$$

Here, the operator arg{ } specifies that only the phase of the complex values of the distortion function $T(e^{j\Omega})$ should be taken into account. The operator $\partial/\partial\Omega$ represents differentiation with respect to $\Omega$. Thus, the group delay $\tau(\Omega)$ is the derivative of the phase response of the distortion function $T(e^{j\Omega})$ with respect to the normalized angular frequency $\Omega$. The group delay $\tau(\Omega)$ is a measure of how strongly individual spectral components of a signal transmitted through the filter bank configuration are offset in time with respect to one another.

FIG. 3 shows the group delay $\tau(\Omega)$ for a filter bank configuration from the prior art, which is used in a hearing aid in order to allow frequency-dependent amplification of a microphone signal. The design of the filter bank configuration corresponds to those as per FIG. 2. Here, the following values were selected as amplification factors $F_l$:

$F_l = 1$ for $l = 1 \ldots 11$,
$F_l = 50$ for $l = 12 \ldots 19$,
$F_l = 300$ for $l = 20 \ldots 27$,
$F_l = 15$ for $l = 28 \ldots 35$,
$F_l = 1$ for $l = 36 \ldots 64$.

The group delay $\tau(\Omega)$ is plotted in FIG. 3 for the various values of $\Omega$. Here, the horizontal axis does not plot the value $\Omega$, but merely the index l of the corresponding channel for a few values of $\Omega$. The diagram in FIG. 3 shows that the group delay $\tau(\Omega)$ has the value of 64 for most frequencies $\Omega$. However, the group delay $\tau(\Omega)$ undesirably deviates significantly from the value 64 at the transitions between channels for which the factors $F_l$ respectively differ strongly from one another as per the above listing. The group delay has a value of almost 120 at the transition locations. The large differences in the group delays $\tau(\Omega)$ for various frequencies $\Omega$ are perceived by a user of the hearing aid as an unwanted distortion of the output signal.

SUMMARY OF THE INVENTION

It is accordingly an object of the invention to provide a filter bank configuration for a hearing device which overcomes the above-mentioned disadvantages of the heretofore-known devices and methods of this general type and which provides for a filter bank that allows the amplification of signals in individual channels of the filter bank configuration, without perceivable distortions being caused in the process due to strong deviations in the group delay of the filter bank configuration for individual frequencies.

With the foregoing and other objects in view there is provided, in accordance with the invention, a filter bank configuration for a hearing device, comprising:

an analysis filter bank having a plurality of filters;

a synthesis filter bank having a plurality of filters corresponding to and coupled in pairs with respective said filters in said analysis filter bank, with each pair of coupled filters forming a channel;

means provided for at least one said channel for changing a phase of a signal transmitted by said channel, in order to reduce a difference between a group delay of the filter bank configuration and a prescribable reference value for at least one predetermined frequency.

In other words, in the filter bank configuration according to the invention, filters in an analysis filter bank and corresponding filters in a synthesis filter bank are coupled in pairs, with each pair of coupled filters forming a channel. Here, means are provided for at least one channel formed in this fashion in order to change a phase of a signal transmitted by the channel such that a difference between a group delay of the filter bank configuration and a prescribable reference value is reduced for at least one predetermined frequency. An advantage of influencing the phase of the signal in at least one channel by the means for change is that a deviation of the group delay of the entire filter bank configuration from a reference value can be reduced in a targeted fashion. Herein, the reference value should be understood to mean that value that the group delays of the filter bank configuration should have for as many frequencies as possible such that this results in only a small distortion of the signal.

The type of the required change in the phase of the signal can be determined by numerical methods for a given filter bank configuration. The change is preferably a constant phase contribution that is added to the phase of the complex signal in a channel. The type of change can then be determined in advance. However, the change in the phase can also be undertaken by means of an adaptation while the filter bank configuration is operating.

In the process, the means, provided according to the invention, for changing the phase can be provided in many different variants. In this context, the filter bank configuration according to the invention is developed in an advantageous fashion if at least one filter in the analysis filter bank is coupled to the corresponding filter in the synthesis filter bank via a scaling apparatus, wherein the scaling apparatus can be used to multiply a sub-band signal by a factor. Here, the factor in the scaling apparatus corresponding to a complex value, the phase of which being determined such that the difference between the group delay of the filter bank configuration and the prescribable reference value is reduced for at least one predetermined frequency, is provided as means for changing the phase.

Coupling the filters of a pair of coupled filters via a scaling apparatus, which can multiply a sub-band signal in the corresponding channel by a complex factor, allows a particularly simple combination of an amplification of the sub-band signal with a change in the phase thereof.

The use of a scaling apparatus with a complex factor moreover results in the advantage of providing an option for being able to find out in a very simple fashion by routine investigations which change in the phase, for a given filter bank configuration, results in a desired reduction from the reference value of a deviation from the group delay in the filter bank configuration.

Here, in the scaling apparatus, provision is preferably made for the phase of the factor to be determined as a function of a sum of a mean group delay of the assigned filter in the analysis filter bank and a mean group delay of the corresponding filter in the synthesis filter bank. Here, a mean group delay of the respective filter should be understood to be the mean value of the group delays formed for all those frequencies belonging to the pass band and the roll-off band of the filter. The determination of the phase of the factor in this fashion results in the advantage of it being possible for the deviation from the group delay to be reduced to a small value in a targeted fashion.

The filter bank configuration according to the invention is advantageously developed if a delay, caused by the phase of the factor, of a sub-band signal transmitted via the scaling apparatus, together with the sum of the mean group delays, corresponds to a value that is an integer multiple of the number of channels in the filter bank configuration. This can advantageously minimize the difference.

In a preferred embodiment of the filter bank configuration according to the invention, the analysis filter bank is a complex-modulated polyphase filter bank with a first prototype filter, from which the filters in the analysis filter bank are respectively formed as a function of a characteristic value 1 for the channel, and in which the synthesis filter bank likewise is a complex-modulated polyphase filter bank with a second prototype filter.

In this embodiment, in the scaling apparatus, the phase of the factor depends on the characteristic value 1 for the channel, the number I of channels in the filter bank configuration, and the sum of the mean group delay of the first prototype filter and the mean group delay of the second prototype filter. Here, the characteristic value of the channel is that factor that is required to determine how far the prototype filter should be displaced along the frequency by the complex modulation in order to form the filter in the analysis filter bank for the corresponding channel.

The use of a complex-modulated filter bank results in the advantage that only two filters, to be precise the prototype filter of the analysis filter bank and the prototype filter of the synthesis filter bank, have to be examined for determining the phase of the factor. This makes it particularly simple in a corresponding filter bank configuration to reduce in a desired fashion the deviations of the group delays from the reference value.

Here, a particular advantage arises if the first prototype filter and the second prototype filter each are a FIR filter (FIR—finite impulse response), possibly even a linear-phase FIR filter. A FIR filter allows simple and also precise calculation of a mean group delay. A linear-phase filter is distinguished by a constant group delay.

In another development of the filter bank configuration according to the invention, the filter in the analysis filter bank and the filter in the synthesis filter bank each are a FIR filter in at least one pair of coupled filters, with the sum of the mean group delays of the two filters being an integer multiple of the number of channels in the filter bank configuration. The advantage of this is that as a result of using these filters the group delays of the filter bank configuration for different frequencies already only deviate slightly from one another. In particular, this allows the use of a real value as a factor in the scaling apparatus, as a result of which there is a reduction in the number of computational operations when processing a signal compared to a scaling apparatus with a complex factor. An integer multiple of the number I of channels here results as kI, with k=0, 1, 2, . . . . Here, the filter in the analysis filter bank and the filter in the synthesis filter bank each are preferably a linear-phase FIR filter in the at least one pair of coupled filters, with the sum of the filter orders being an integer multiple of double the number of channels in the filter bank configuration. Here, the filter order emerges as the number of coefficients of the FIR filter less one. In this development of the filter bank configuration, the requirement that the sum of the mean group delays should be an integer multiple of the number of channels can be satisfied particularly easily by selecting an appropriately long FIR filter.

In another development of the filter bank configuration according to the invention, a FIR filter is provided as a first filter of the pair as means for changing the phase in at least one pair of coupled filters, which FIR filter is determined by a sequence of coefficients that is the result of reversing a sequence of coefficients of a FIR filter, which corresponds to a filter matched to the second filter of the pair. In other words, a suitable change in the phase can be achieved in some FIR filters by virtue of the fact that, compared to a filter bank configuration in the prior art, use is simply made of the coefficients of the FIR filters in a reverse sequence.

Thus, if filters in the analysis filter bank and in the synthesis filter bank of a filter bank configuration are designed as coordinated filters in an analysis-synthesis filter bank by means of a standard design method, provision can be made for using the coefficients of at least one of the filters in a reverse sequence in the filter bank configuration in order to achieve the aforementioned object. An advantage emerging from this is that the desired change in the phase is brought about without any additional complexity.

Here, it is preferable for use to be made of an apparatus for calculating a discrete Fourier transform (DFT) in at least one of the filter banks. Compared to filter bank configurations in the prior art, which often operate using the inverse discrete Fourier transform (IDFT), the use of the discrete Fourier transform (DFT) can develop a filter bank configuration, the design of which is particularly simple and in which the group delays of the filter bank configuration for different frequencies nevertheless only deviate slightly from one another.

Instead of a reverse sequence of the coefficients of the FIR filters, or in addition thereto, another development of the filter bank configuration according to the invention provides for provision to be made for at least one complex-modulated, uniform filter bank, in which filters in the filter bank are made of a prototype filter in each case formed by a complex modulation by means of a DFT or IDFT, wherein the filter bank as means for changing the phase is designed to reverse a sequence of values of an input signal and/or an output signal from an apparatus for calculating the DFT or IDFT. Interchanging the sequence of the sampling values of an input signal or the calculated values of an output signal brings about the same advantageous effect as interchanging the coefficients of a FIR filter.

In another advantageous development of the filter bank configuration according to the invention, the sum of the mean group delay of the filter in the analysis filter bank and the mean group delay of the corresponding filter in the synthesis filter bank is equal in all pairs of coupled filters. This results in the advantage of the deviation of the group delays from the reference value being able to be minimized with little complexity for all frequencies that can be processed by the filter bank configuration.

Herein, the sum of the mean group delays is preferably an integer multiple of the number of channels. This results in the particular advantage of the minimization resulting by itself without any additional complexity.

Other features which are considered as characteristic for the invention are set forth in the appended claims.

Although the invention is illustrated and described herein as embodied in a filter bank configuration for a hearing device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
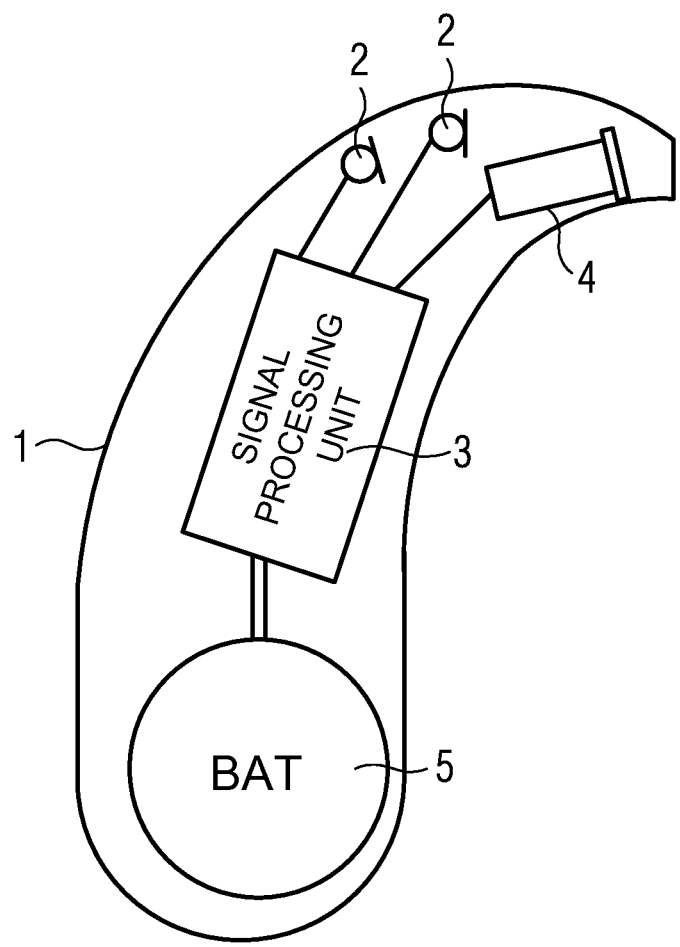
FIG. 1 shows a schematic illustration of the basic design of a hearing aid.
Figure 2:
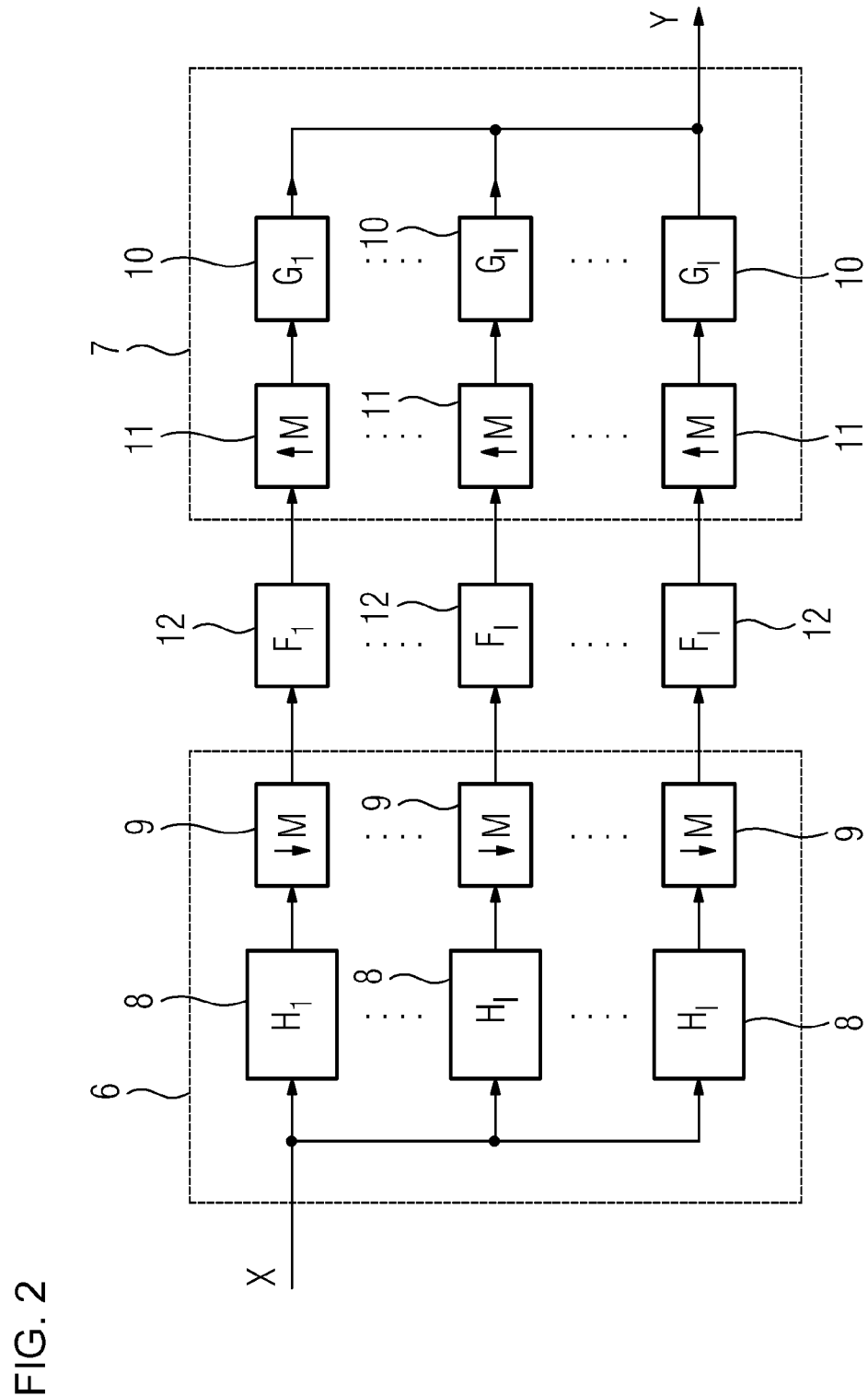
FIG. 2 shows a signal-flow graph for a filter bank configuration.
Figure 3:
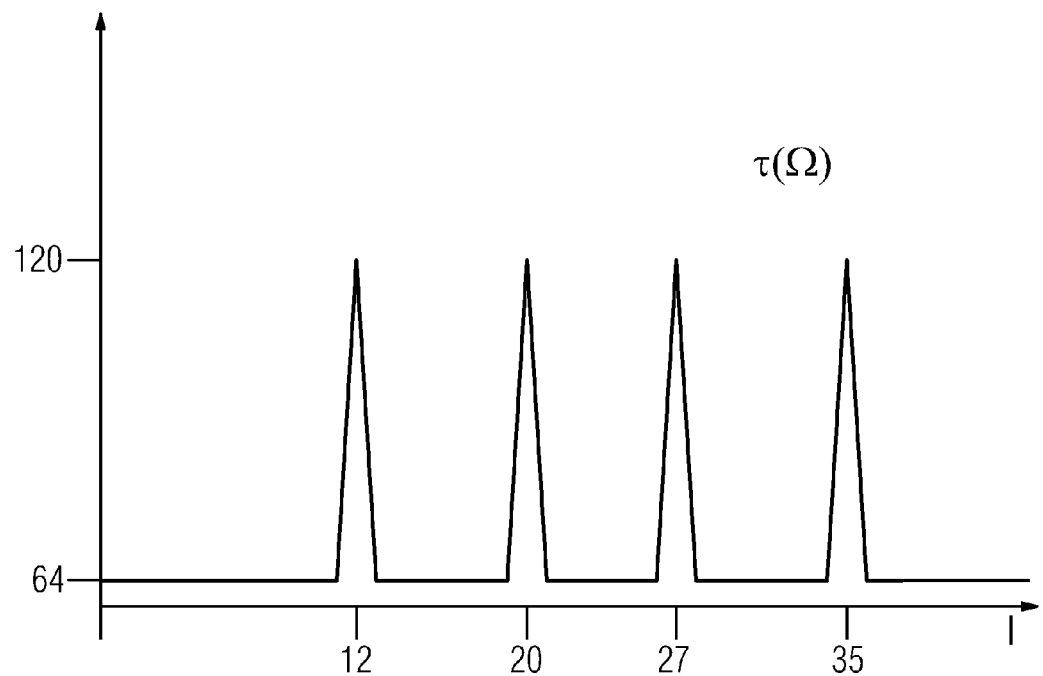
FIG. 3 shows a diagram with a graph of the group delay $\tau(\Omega)$ as resulting for a filter bank configuration as per the prior art.
Figure 4:
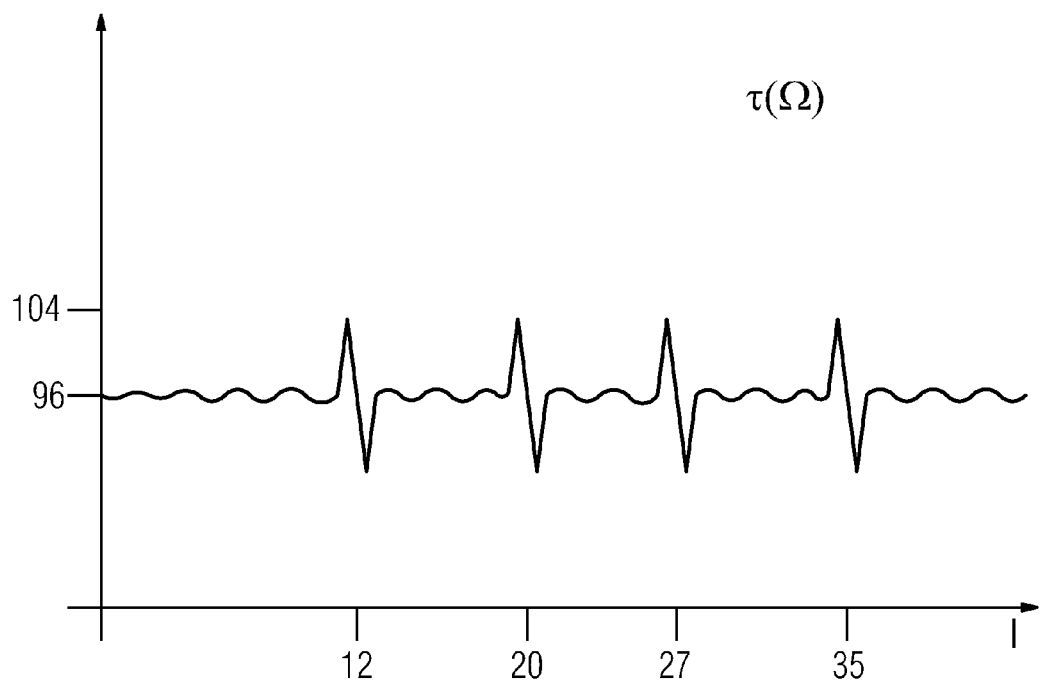
FIG. 4 shows a diagram with a graph of the group delay $\tau(\Omega)$ as resulting for an embodiment of the filter bank configuration according to the invention.

Referring now once more to the figures of the drawing in detail, FIG. 4 shows a diagram with a graph of a group delay $\tau(\Omega)$, wherein the axes of the diagram correspond to the axes of the diagram illustrated in FIG. 3. In terms of design, these two filter banks correspond to the filter bank illustrated in FIG. 2.

Here, the filter bank in FIG. 4 consists of a complex-modulated polyphase filter bank with $H_1$ as a prototype low-pass filter. The band-pass filters $H_2$ to $H_I$ correspond in their amplitude response to the filter $H_1$, wherein, however, the central frequency of a pass band has in each case been displaced to a frequency $\Omega=2\pi(l-1)/I$ by a complex modulation.

In contrast to the filter bank that is the basis of the graph in FIG. 3, the filter bank belonging to the graph in FIG. 4 has complex values $F_l$, $l=1\ldots I$, as factors for the multipliers 12, which are formed according to the following equation 4:

$$F_l = F_l e^{-j2\pi(l-1)r/I}. \quad \text{Equ. 4}$$

The real factors $F_l$, $l=1\ldots I$, are the same that are also used in the filter bank that is the basis of the graph in FIG. 3.

In the filter bank configuration, the phase of each factor $F_l$, $l=1\ldots I$, is calculated as $-2\pi(l-1)r/I$. Thus, it depends on the channel index l, by means of which the central frequency of the corresponding channel is also determined. The phase of each complex factor $F_l$ moreover depends on an integer value r, which is formed from a mean group delay $\tau_H$ of the low-pass prototype filter $H_1$ and a mean group delay $\tau_G$ of the low-pass prototype filter $G_1$. The value of r is calculated as per equation 5:

$$r = (\tau_H + \tau_G)_I. \quad \text{Equ. 5}$$

Here, the operator $(\ )_I$ is a modulo-operator, which determines the remainder of a division of the value between parentheses by the number I of channels. The value r is preferably an integer value.

Here, the mean group delay $\tau_H$ is calculated as the mean value of the group delays of $H_1$ for frequencies in the pass and roll-off bands of $H_1$. The same applies to $\tau_G$ in respect of $G_1$. The present filter bank configuration comprises I=64 channels, and the mean group delays are $\tau_H=44.11$ and $\tau_G=52.25$. Thus, the remainder of a division of the sum $\tau_H+\tau_G=96.36$ by I is a value of 32.36. Hence, r=32 is fixed as the closest integer value.

The two low-pass prototype filters $H_1$ and $G_1$ are FIR filters. The complex modulation of the prototype filter $H_1$, and the filtering of the input signal X, are brought about by means of an IDFT in the analysis filter bank. An IDFT for the complex modulation of the prototype filter $G_1$ and filtering by means of an IDFT are brought about in a corresponding fashion in the synthesis filter bank as well.

According to the graph in FIG. 4, the group delay $\tau(\Omega)$ of the filter bank configuration is approximately 96 for most frequencies $\Omega$. This value constitutes the desired group delay for the filter bank configuration with complex factors $F_l$, $l=1\ldots I$. The filter bank configuration has a higher time delay than the filter bank configuration that is the basis for the graph in FIG. 3. However, a user of the associated hearing aid does not even perceive a group delay of 96 as a bothersome time offset between the output signal Y and that sound signal that may reach the eardrum of the user in an unprocessed fashion. The value 96 for the group delay results from using the complex factors $F_l$, $l=1\ldots I$, rather than the real values $F_l$, $l=1\ldots I$.

The phase of each complex factor $F_l$ results in a change in the group delay in the corresponding channel l, which, together with the mean group delays $\tau_H$ and $\tau_G$ of the filters $H_1$ and $G_1$ forming the channel l, result in an overall mean group delay that is an integer multiple of the number I of channels. Overall, this causes the deviation in the filter bank configuration of the group delay $\tau(\Omega)$ to deviate only slightly from the desired group delay 96 at the transitions between channels with different factors $F_l$. The deviation is less than 10 percent. Hence a user of the hearing aid cannot hear a significant signal distortion.

In addition to complex factors $F_l$, or as an alternative thereto, provision can also be made for the use of pairs of filters $H_1$ and $G_1$, in which the sum of the mean group delay $\tau_H$ and $\tau_G$ is an integer multiple of the number I of channels and so $\tau_H+\tau_G=k$ I holds true, wherein k is an integer. In accordance with equation 5, this then results in a value of r=0, and so the complex factors $F_l$ are identical to the real factors $F_l$.

Figure 5:
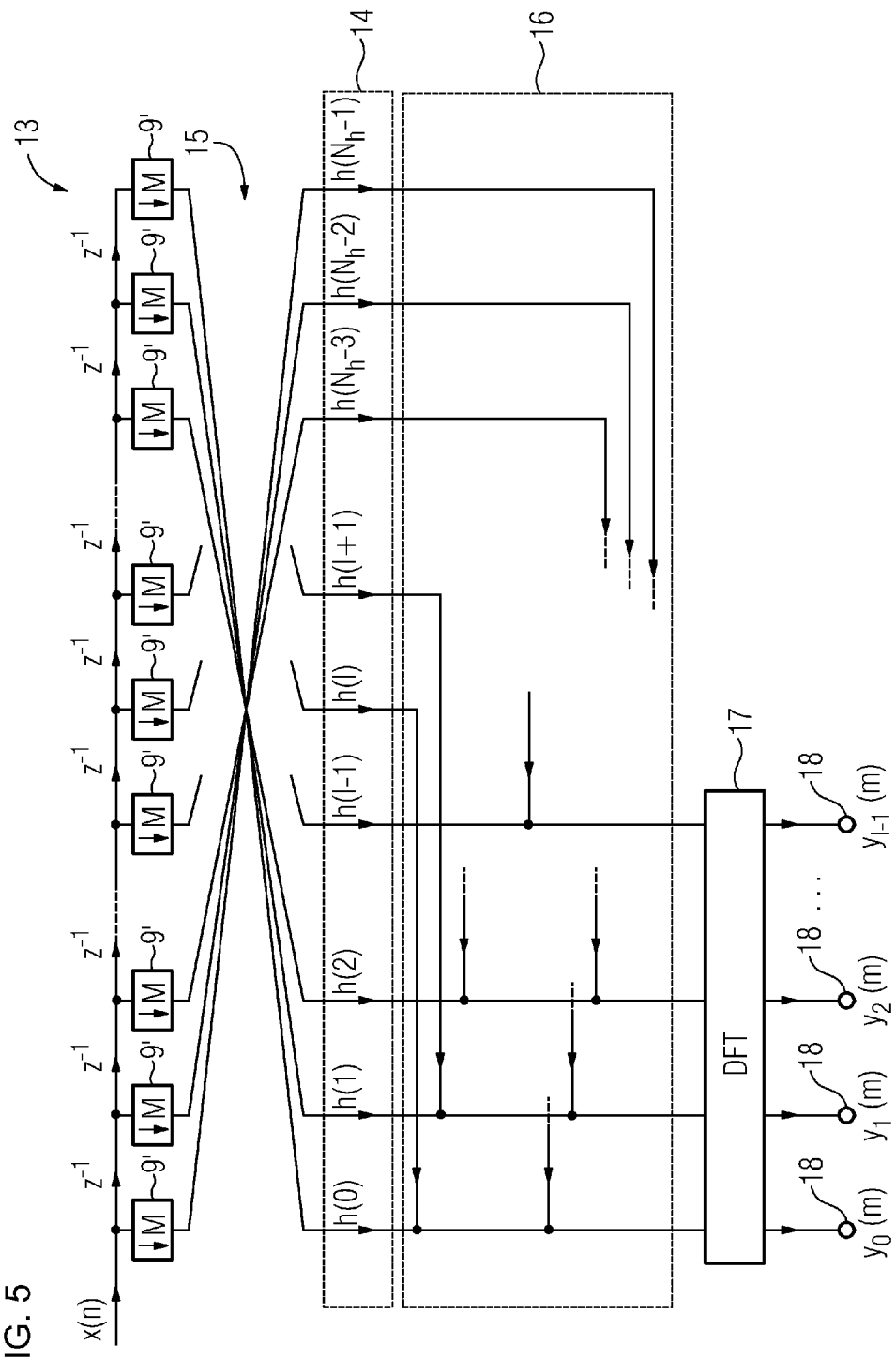
FIG. 5 shows a signal-flow graph for an analysis filter bank in an embodiment of the filter bank configuration according to the invention, wherein a sequence of values of an input signal can be reversed in the analysis filter bank.

FIG. 5 illustrates a signal-flow graph of an analysis filter bank 13. A current digital input value x(n) at an instantaneous sampling time n is applied to an input of the analysis filter bank. Further input values x(n−1), x(n−2), etc. from preceding sampling times n−1, n−2, etc. are provided at outputs of delay elements $z^{-1}$. A total of $N_h$ input values are stored at a particular sampling time n.

The effect of a clock reduction by the factor 1/M is that a set of I=64 output values $y_0(m)$ to $y_{I-1}(m)$ is only calculated at merely every M-th sampling time. The changed clock rate is indicated in the output values $y_0(m)$ to $y_{I-1}(m)$ by a new time index of m in place of n. The reduction in the clock itself is symbolized by clock-rate reducers 9' in the signal-flow graph in FIG. 5. In the present case, the value of the clock reduction is M=16.

In order to calculate the corresponding output values $y_0(m)$ to $y_{I-1}(m)$, the sequence of input values x(n), x(n−1), x(n−2), etc. is first of all multiplied by a sequence of filter coefficients 14. For this, the sequence of input values x(n), x(n−1), x(n−2) is first of all reversed by means of a reversal operation 15. Overall, this results in the following $N_h$ multiplications: x(n) h($N_h$−1), x(n−1)h($N_h$−2), . . . , x(n−$N_h$+1)h(0).

Subsequently, additions 16 link to one another the results of the multiplications as per a polyphase filter bank, and so this results in a total of I values.

These I values are used to calculate the complex output values $y_0(m)$ to $y_{I-1}(m)$ by means of a discrete Fourier transform 17. Each of the output values $y_0(m)$ to $y_{I-1}(m)$ is a value for one of the total of I channels 18 in a filter bank configuration in which the analysis filter bank 13 is utilized. Compared to an analysis filter bank in which there is no provision for the reversal operation 15 and in which an inverse Fourier transform is used instead of a discrete Fourier transform, the complex output values $y_0(m)$ to $y_{I-1}(m)$ of the analysis filter bank 13 illustrated in FIG. 5 have a phase that differs by a value of $-2\pi(l-1)(N_h-1)/I$, wherein l=1 . . . I refers to the respective channel. Here, the output signal $y_{l-1}(m)$ is transmitted in a channel 1.

In the process, the filters of the analysis filter bank 13 and of the corresponding synthesis filter bank (not illustrated in FIG. 5) in the filter bank configuration are selected such that the value r, calculated as per equation 5, precisely corresponds to the value $N_h$−1. As a result of this, the reversal operation 15 and the use of the discrete Fourier transform cause group delays of the filter bank configuration to deviate as little from another as possible, like in the filter bank that is the basis of the graph in FIG. 4 and in which complex factors $F_1$ are used, and so distortions can hardly be perceived in a processed signal.

Hence, an amplification of the individual output values $y_0(m)$ to $y_{I-1}(m)$ for compensating for a loss of hearing can be brought about by real values $F_1$ in the filter bank configuration in FIG. 5. This reduces the number of computational operations compared to a multiplication of the output values $y_0(m)$ to $y_{I-1}(m)$ by complex values.

Instead of the reversal operation 15 for the sequence of input values x(n), x(n−1), x(n−2), a reversal operation can also be provided for the sequence of filter coefficients 14. Furthermore, provision can be made for input values or filter coefficients or output values to be reversed in a synthesis filter bank by a corresponding reversal operation. A combination of the reversal operations can also be provided.

The examples show how means can be provided for reducing a distortion in an output signal of a filter bank configuration, which distortion is caused as a result of differences in the group delays in the filter bank configuration for different frequencies.

The invention claimed is:

1. A filter bank configuration for a hearing device, comprising:
an analysis filter bank having a plurality of filters;
a synthesis filter bank having a plurality of filters corresponding to and coupled in pairs with respective said filters in said analysis filter bank, with each pair of coupled filters forming a channel;
means provided for at least one said channel for changing a phase of a signal transmitted by said channel, in order to reduce a difference between a group delay of the filter bank configuration and a prescribable reference value for at least one predetermined frequency; and
a scaling apparatus connecting at least one filter in said analysis filter bank to a corresponding said filter in said synthesis filter bank;
wherein said scaling apparatus is configured to multiply a sub-band signal by a given factor, and the factor, forming said means for changing the phase in said scaling apparatus, corresponds to a complex value having the phase determined such that the difference between the group delay of the filter bank configuration and the prescribable reference value is reduced for the at least one predetermined frequency.

2. The filter bank configuration according to claim 1, wherein said scaling apparatus is configured to determine the phase of the factor as a function of a sum of a mean group delay of the assigned said filter in said analysis filter bank and a mean group delay of the corresponding said filter in said synthesis filter bank, wherein the mean group delays respectively are a mean value of the group delays of the respective said filter for frequencies in a pass band and in a roll-off band.

3. The filter bank configuration according to claim 1, wherein a delay, caused by the phase of the factor, of a sub-band signal transmitted via said scaling apparatus, together with the sum of the mean group delays, corresponds to a value that is an integer multiple of a number of channels in the filter bank configuration.

4. The filter bank configuration according to claim 1, wherein:
said analysis filter bank is a complex-modulated polyphase filter bank with a first prototype filter, from which said filters in said analysis filter bank are respectively formed as a function of a characteristic value for the channel;
said synthesis filter bank is a complex-modulated polyphase filter bank with a second prototype filter; and
the phase of the factor in said scaling apparatus depends on:
a characteristic value for the channel;
a number of channels in the filter bank configuration; and
a sum of the mean group delay of said first prototype filter and the mean group delay of said second prototype filter.

5. The filter bank configuration according to claim 4, wherein each of said first prototype filter and said second prototype filter is a finite impulse response (FIR) filter.

6. The filter bank configuration according to claim 5, wherein said FIR filter is a linear-phase FIR filter.

7. A filter bank configuration for a hearing device, comprising:
an analysis filter bank having a plurality of filters;
a synthesis filter bank having a plurality of filters corresponding to and coupled in pairs with respective said filters in said analysis filter bank, with each pair of coupled filters forming a channel;
means provided for at least one said channel for changing a phase of a signal transmitted by said channel, in order to reduce a difference between a group delay of the filter bank configuration and a prescribable reference value for at least one predetermined frequency;

wherein said filter in said analysis filter bank and said filter in said synthesis filter bank each are a finite impulse response filter in at least one pair of coupled filters, and wherein a sum of the mean group delays of said two filters is an integer multiple of a number of channels in the filter bank configuration.

8. A filter bank configuration for a hearing device, comprising:

an analysis filter bank having a plurality of filters;

a synthesis filter bank having a plurality of filters corresponding to and coupled in pairs with respective said filters in said analysis filter bank, with each pair of coupled filters forming a channel;

means provided for at least one said channel for changing a phase of a signal transmitted by said channel, in order to reduce a difference between a group delay of the filter bank configuration and a prescribable reference value for at least one predetermined frequency;

wherein said filter in said analysis filter bank and said filter in said synthesis filter bank each are a linear-phase finite impulse response (FIR) filter in at least one pair of coupled filters, and wherein a sum of a filter order of said FIR filter in said analysis filter bank and a filter order of said FIR filter in said synthesis filter bank is an integer multiple of twice a number of channels in the filter bank configuration.

9. A filter bank configuration for a hearing device, comprising:

an analysis filter bank having a plurality of filters;

a synthesis filter bank having a plurality of filters corresponding to and coupled in pairs with respective said filters in said analysis filter bank, with each pair of coupled filters forming a channel;

means provided for at least one said channel for changing a phase of a signal transmitted by said channel, in order to reduce a difference between a group delay of the filter bank configuration and a prescribable reference value for at least one predetermined frequency;

wherein a first filter of a pair is a finite impulse response (FIR) filter as a means for changing the phase in at least one pair of coupled filters, which FIR filter is determined by a sequence of coefficients that is the result of reversing a sequence of coefficients of a FIR filter, which corresponds to a filter matched to the second filter of the pair.

10. The filter bank configuration according to claim 9, wherein at least one of said filter banks includes an apparatus for calculating a discrete Fourier transform.

11. A filter bank configuration for a hearing device, comprising:

an analysis filter bank having a plurality of filters;

a synthesis filter bank having a plurality of filters corresponding to and coupled in pairs with respective said filters in said analysis filter bank, with each pair of coupled filters forming a channel;

means provided for at least one said channel for changing a phase of a signal transmitted by said channel, in order to reduce a difference between a group delay of the filter bank configuration and a prescribable reference value for at least one predetermined frequency;

wherein at least one of said filters is a complex-modulated, uniform filter bank, having filters in said filter bank made of a prototype filter in each case formed by a complex modulation by means of a discrete Fourier transform (DFT) or inverse discrete Fourier transform (IDFT), wherein said filter bank, as means for changing the phase, is configured to reverse a sequence of values of an input signal and/or an output signal from an apparatus for calculating the DFT or IDFT.

12. A filter bank configuration for a hearing device, comprising:

an analysis filter bank having a plurality of filters;

a synthesis filter bank having a plurality of filters corresponding to and coupled in pairs with respective said filters in said analysis filter bank, with each pair of coupled filters forming a channel;

means provided for at least one said channel for changing a phase of a signal transmitted by said channel, in order to reduce a difference between a group delay of the filter bank configuration and a prescribable reference value for at least one predetermined frequency;

wherein a sum of the mean group delay of a respective said filter in said analysis filter bank and the mean group delay of the corresponding said filter in said synthesis filter bank is equal in all pairs of coupled filters.

13. The filter bank configuration according to claim 12, wherein the sum of the mean group delays is an integer multiple of a number of channels in the filter bank configuration.

* * * * *

UNITED STATES PATENT AND TRADEMARK OFFICE
CERTIFICATE OF CORRECTION

PATENT NO. : 8,532,319 B2  
APPLICATION NO. : 12/833171  
DATED : September 10, 2013  
INVENTOR(S) : Robert Bäuml et al.

Page 1 of 1

It is certified that error appears in the above-identified patent and that said Letters Patent is hereby corrected as shown below:

Title Page

The correct spelling of the first-named inventor, item (12) is: Bäuml et al.

The inventors should be listed as follows:

(75) Inventors: Robert Bäuml, Eckental (DE); Heinz Goeckler, Backnang (DE); Thomas Kurbiel, Erkenschwik (DE); Henning Puder, Erlangen (DE); Wolfgang Sörgel, Erlangen (DE).

Signed and Sealed this  
Twenty-ninth Day of October, 2013

Teresa Stanek Rea  
*Deputy Director of the United States Patent and Trademark Office*